(12) United States Patent
Kim et al.

(10) Patent No.: US 9,136,394 B2
(45) Date of Patent: Sep. 15, 2015

(54) NONVOLATILE MEMORY DEVICE AND METHOD FOR FABRICATING THE SAME

(71) Applicant: SK hynix Inc., Gyeonggi-do (KR)

(72) Inventors: Min-Soo Kim, Gyeonggi-do (KR);
Young-Jin Lee, Gyeonggi-do (KR);
Sung-Jin Whang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 91 days.

(21) Appl. No.: 13/720,123

(22) Filed: Dec. 19, 2012

(65) Prior Publication Data

US 2014/0054673 A1    Feb. 27, 2014

(30) Foreign Application Priority Data

Aug. 21, 2012   (KR) .................. 10-2012-0091100

(51) Int. Cl.
| | |
|---|---|
| H01L 29/762 | (2006.01) |
| H01L 29/792 | (2006.01) |
| H01L 29/66 | (2006.01) |
| H01L 27/115 | (2006.01) |

(52) U.S. Cl.
CPC ........ *H01L 29/792* (2013.01); *H01L 27/11582* (2013.01); *H01L 29/66833* (2013.01); *H01L 29/7926* (2013.01)

(58) Field of Classification Search
None
See application file for complete search history.

(56) References Cited

U.S. PATENT DOCUMENTS

2012/0273865 A1*  11/2012  Lee et al. .................. 257/316

FOREIGN PATENT DOCUMENTS

| KR | 101083637 | 11/2011 |
|---|---|---|
| KR | 1020130077450 | 7/2013 |

* cited by examiner

*Primary Examiner* — Fernando L. Toledo
*Assistant Examiner* — Valerie N Newton
(74) *Attorney, Agent, or Firm* — IP & T Group LLP (57) ABSTRACT

This technology relates to a nonvolatile memory device and a method for fabricating the same. The nonvolatile memory device may include a pipe connection gate electrode over a substrate, one or more pipe channel layers formed within the pipe connection gate electrode, pairs of main channel layers each connected with the pipe channel layer and extended in a direction substantially perpendicular to the substrate, a plurality of interlayer insulating layers and a plurality of cell gate electrodes alternately stacked along the main channel layers, and metal silicide layers configured to be in contact with the pipe connection gate electrode. The electric resistance of the pipe connection gate electrode may be greatly reduced without deteriorating the characteristics of the memory layers by forming the metal silicide layers coming in contact with the pipe connection gate electrode.

13 Claims, 13 Drawing Sheets

NONVOLATILE MEMORY DEVICE AND METHOD FOR FABRICATING THE SAME

CROSS-REFERENCE TO RELATED APPLICATIONS

The present application claims priority of Korean Patent Application No. 10-2012-0091100, filed on Aug. 21, 2012, which is incorporated herein by reference in its entirety.

BACKGROUND

1. Field

Exemplary embodiments of the present invention relate to a nonvolatile memory device and a method for fabricating the same, and more particularly, to a three-dimensional (3-D) structured nonvolatile memory device in which a plurality of memory cells are stacked in a vertical direction over a substrate and a method for fabricating the same.

2. Description of the Related Art

A nonvolatile memory device retains stored data although the power is not supplied. A variety of nonvolatile memory devices, such as flash memory, are being widely used.

As the improvement of the degree of integration of two-dimensional (2-D) structured nonvolatile memory devices with memory cells that are formed over a semiconductor substrate in the form of a single layer has reached the limit, there has been proposed a 3-D structured nonvolatile memory device in which a plurality of memory cells is formed along channel layers in a vertical direction from a semiconductor substrate. More particularly, the 3-D structured nonvolatile memory device is mainly divided into a structure having a straight-line type channel layer and a structure having a U-shaped channel layer.

In the structure having a U-shaped channel layer, a pipe connection transistor is used to couple memory cell strings. However, there is a concern in that electric resistance may increase, because the gate electrode of the pipe connection transistor (hereinafter referred to as a pipe connection gate electrode) is mainly made of polysilicon. In particular, an increase in the height of the pipe connection gate electrode to reduce the electric resistance of the pipe connection gate electrode may be limited and may become ineffective in a subsequent process.

SUMMARY

Exemplary embodiments of the present invention are directed to a nonvolatile memory device in which the electric resistance of a pipe connection gate electrode may be greatly reduced by metal silicide layers that come in contact with the pipe connection gate electrode and a method for fabricating the same.

In accordance with an embodiment of the present invention, a nonvolatile memory device may include a pipe connection gate electrode over a substrate, one or more pipe channel layers formed within the pipe connection gate electrode, pairs of main channel layers each connected with the pipe channel layer and extended in a direction substantially perpendicular to the substrate, a plurality of interlayer insulating layers and a plurality of cell gate electrodes alternately stacked along the main channel layers, and metal silicide layers configured to be in contact with the pipe connection gate electrode.

In accordance with another embodiment of the present invention, a method for fabricating a nonvolatile memory device may include forming a conductive layer for a gate electrode, that includes at least one or more sacrificial layer patterns, over a substrate, forming at least one or more trenches by etching the conductive layer to a depth that does not fully penetrate the conductive layer, forming spacers on sidewalls of the trenches, forming a pipe connection gate electrode by etching the conductive layer under trenches, and forming metal silicide layers configured to be in contact with the pipe connection gate electrode.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

Figure 18:
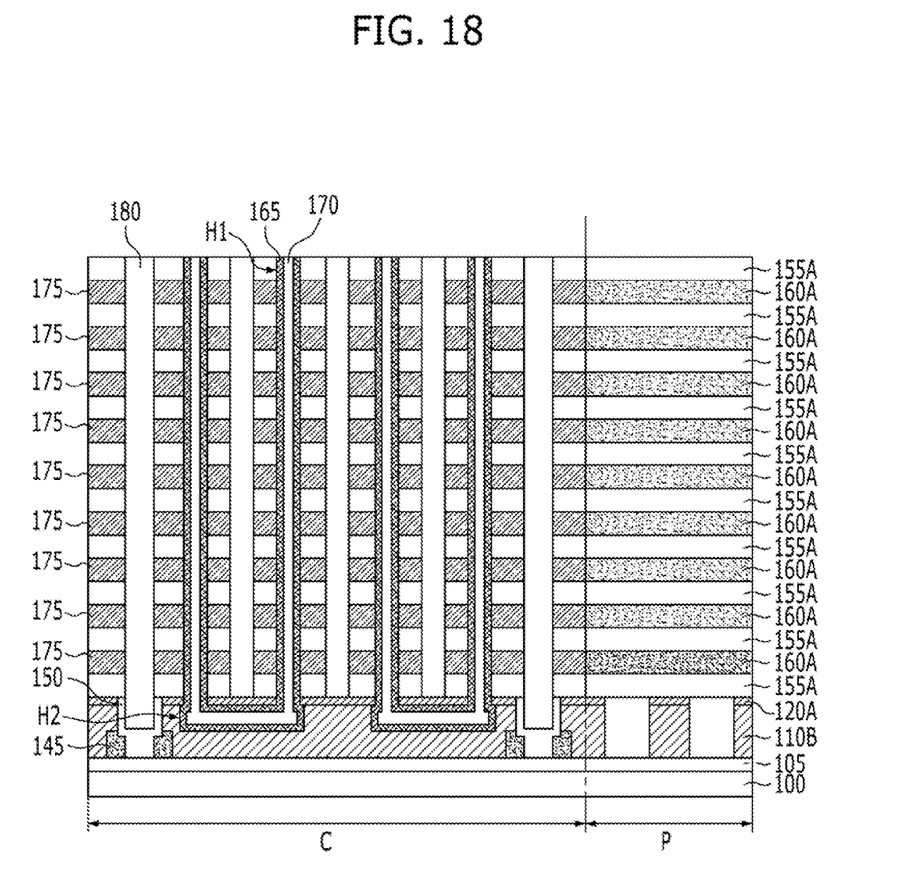
Figure 19:
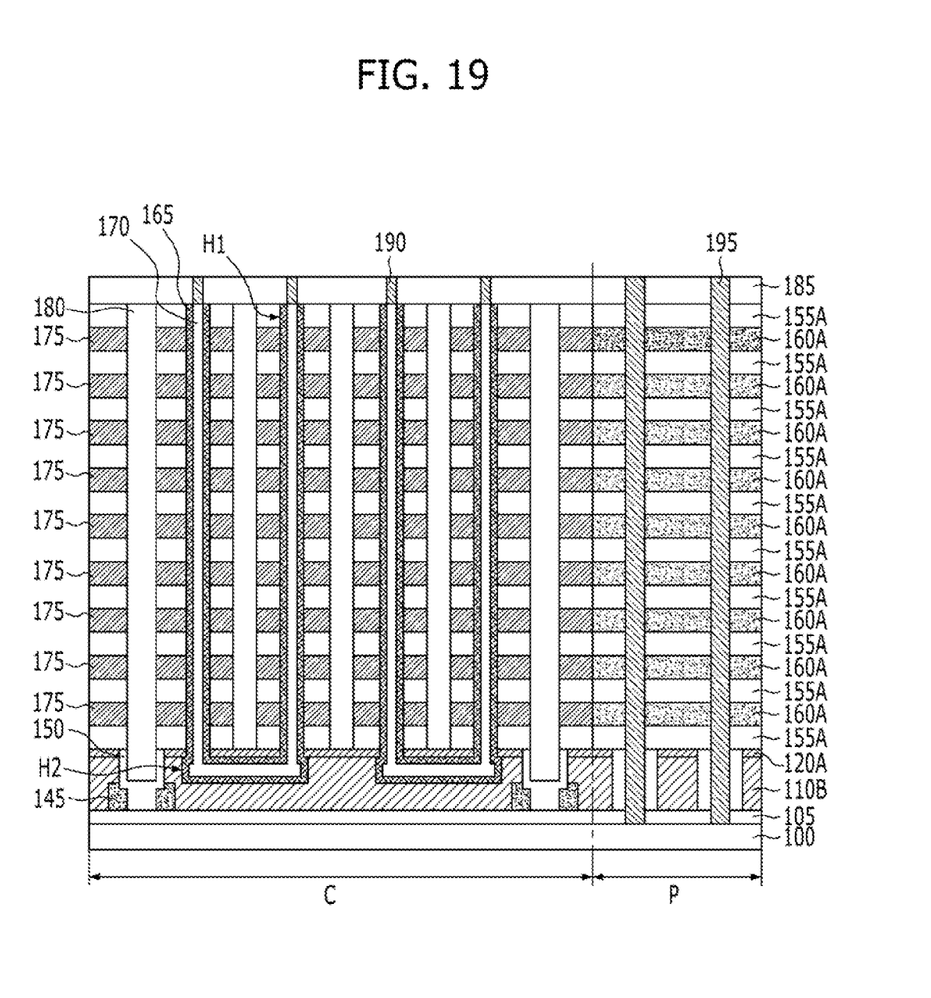

FIGS. 1 to 19 are cross-sectional views illustrating a nonvolatile memory device and a method for fabricating the same in accordance with an embodiment of the present invention, particular, FIG. 19 is a cross-sectional view illustrating the nonvolatile memory device in accordance with an embodiment of the present invention, and FIGS. 1 to 18 are cross-sectional views illustrating an example of intermediate processes for fabricating the nonvolatile memory device of FIG. 19.

Figure 1:
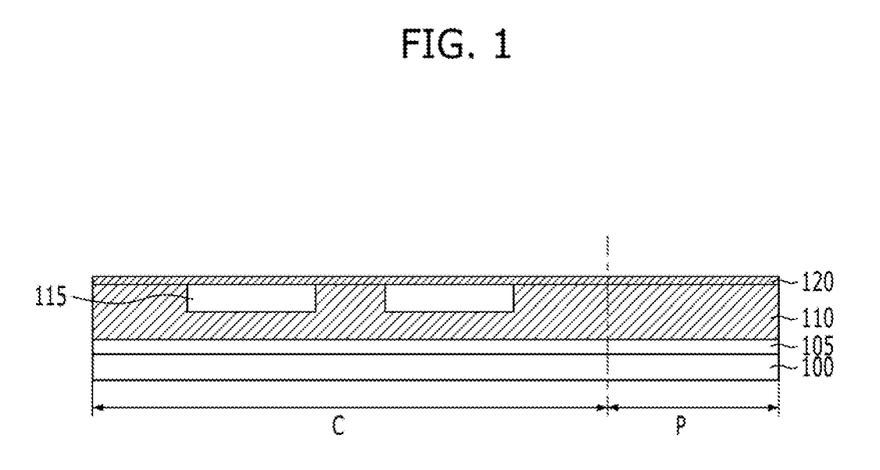
FIGS. 1 to 19 are cross-sectional views illustrating a nonvolatile memory device and a method for fabricating the same in accordance with an embodiment of the present invention.

Referring to FIG. 1, an isolation insulating layer 105 is formed over a substrate 100 having a cell region C and a peripheral region P. A first conductive layer 110 for gate electrodes is formed over the isolation insulating layer 105. The substrate 100 may be a semiconductor substrate, such as single crystalline silicon. The substrate 100 may include specific underlying structures (not shown). Furthermore, the isolation insulating layer 105 may have an oxide-based or nitride-based material. The first conductive layer 110 for gate electrodes includes a semiconductor material, such as silicon (Si) that may form a compound by a reaction with metal. The first conductive layer 110 may be formed by depositing a conductive material, such as doped polysilicon.

Grooves are formed by selectively etching the first conductive layer 110 for gate electrodes in the cell region C. Sacrificial layer patterns 115 are formed in the grooves. Each of the sacrificial layer patterns 115 is removed in a subsequent process, thus functioning to provide a space in which a pipe channel hole to be described later will be formed. The sacrificial layer pattern 115 may have a material having an etch rate different from an etch rate of a second conductive layer 120 for gate electrodes, and the first conductive layer 110 for gate electrodes. Furthermore, the sacrificial layer pattern 115 may have an island form that has a long axis in the direction of the cross section of FIG. 1 and a short axis in a direction crossing the cross section of FIG. 1. A plurality of sacrificial layer patterns 115 may be arranged in a matrix form when viewed from a plane parallel to the substrate 100.

The second conductive layer 120 for gate electrodes is formed on the first conductive layer 110 for gate electrodes and the sacrificial layer patterns 115. The second conductive layer 120 for gate electrodes may be formed by depositing a conductive material, such as doped polysilicon, and may have substantially the same material as the first conductive layer 110 for gate electrodes.

Figure 2:
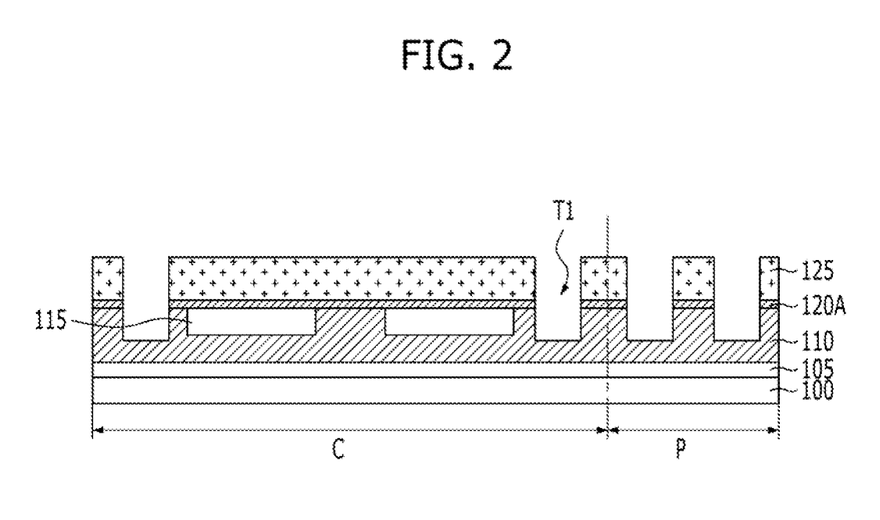

Referring to FIG. 2, a hard mask pattern 125 to cover regions where a pipe connection gate electrode and peripheral gate electrodes will be formed is formed on the second conductive layer 120 for gate electrodes. Trenches T1 are formed by partially etching the second conductive layer 120 for gate electrodes and the first conductive layer 110 for gate electrodes using the hard mask pattern 125 as an etch mask.

The hard mask pattern 125 may include one or more selected from the group that includes an oxide-based or nitride-based material, polysilicon an amorphous carbon layer (ACL), and a bottom anti-reflective coating (BARC) layer. In particular, the trenches T1 may be etched to a depth that does not fully penetrate the first conductive layer 110 for gate electrodes. Meanwhile, the second conductive layer 120 for gate electrodes separated as a result of this process is called second conductive layer patterns 120A for gate electrodes.

Figure 3:
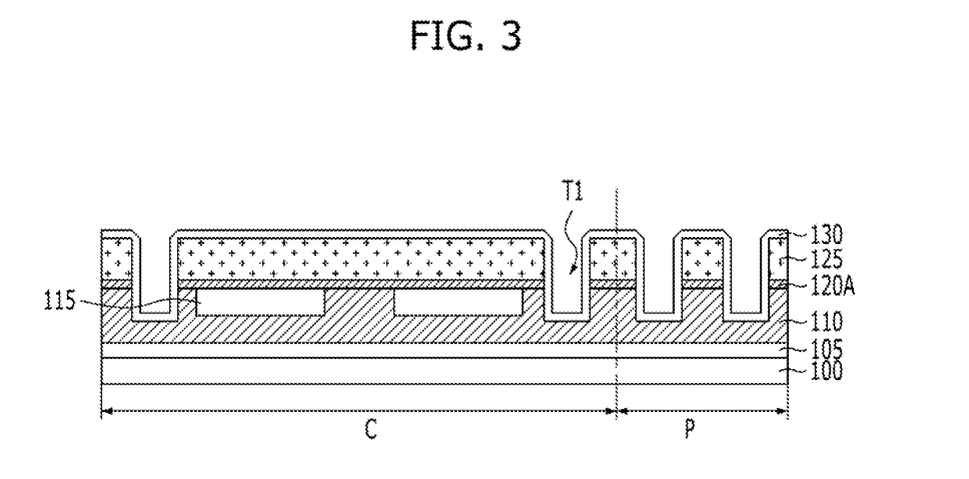

Referring to FIG. 3, a material layer 130 for spacers is formed on the entire surface of the substrate 100 in which the trenches T1 are formed. The material layer 130 for spacers may be used to form spacers on the sidewalls of the trenches T1 in the cell region C and may be formed by depositing an oxide-based or nitride-based material conformably.

Figure 4:
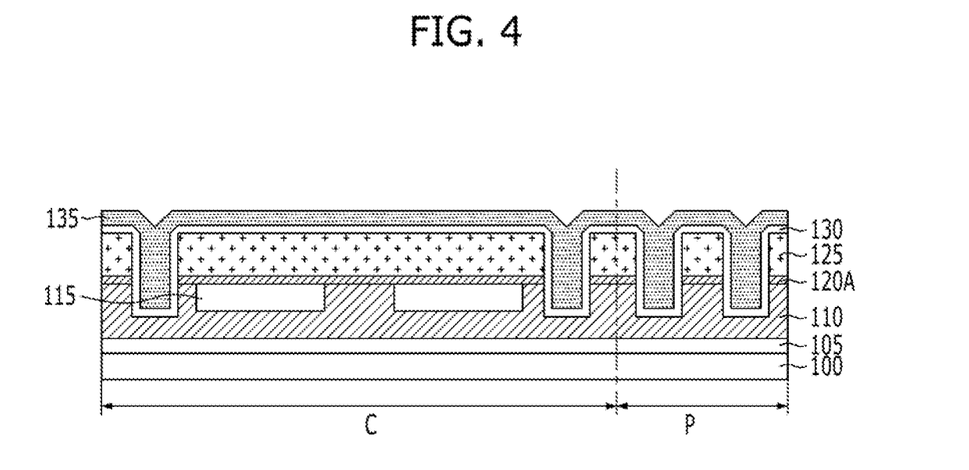

Referring to FIG. 4, a mask layer 135 is formed on the material layer 130. The mask layer 135 may include one or more selected from the group that includes an oxide-based or nitride-based material, polysilicon, an ACL layer, and a BARC layer.

Figure 5:
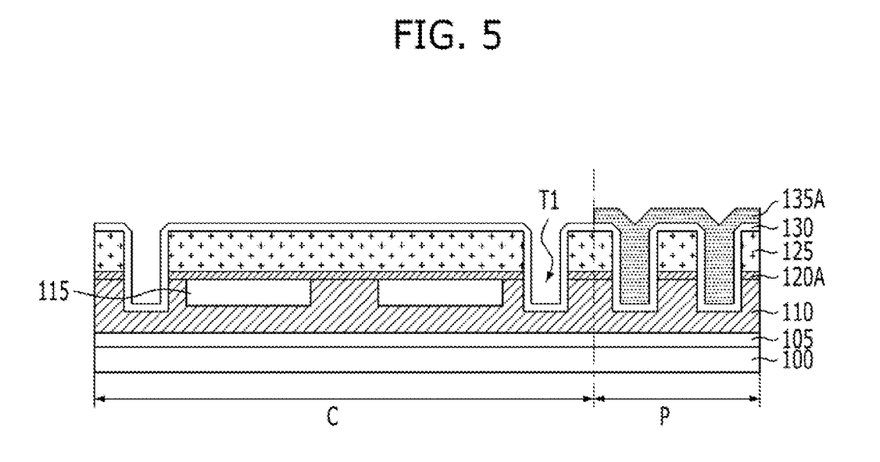

Referring to FIG. 5, a mask pattern 135A to cover the peripheral region P is formed by removing the mask layer 135 of the cell region C. The mask pattern 135A, which is also called a cell open mask, functions to prevent spacers from being formed in the peripheral region P.

Figure 6:
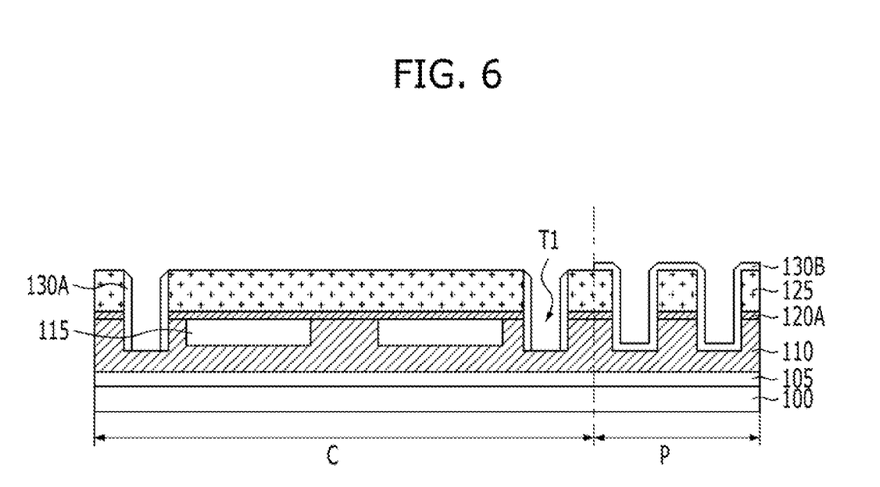

Referring to FIG. 6, spacers 130A are formed on the sidewalls of the trenches T1 in the cell region C by blanket-etching the material layer 130 for spacers so that the first conductive layer 110 for gate electrodes is exposed. Here, the material layer 130 for spacers in the peripheral region P is not etched, because it is protected by the mask pattern 135A. The material layer 130 that remains in the peripheral region P as a result of this process is called a material layer pattern 130B for spacers. In some embodiments, after this process, the remaining mask pattern 135A may be removed by performing an additional cleaning process.

Figure 7:
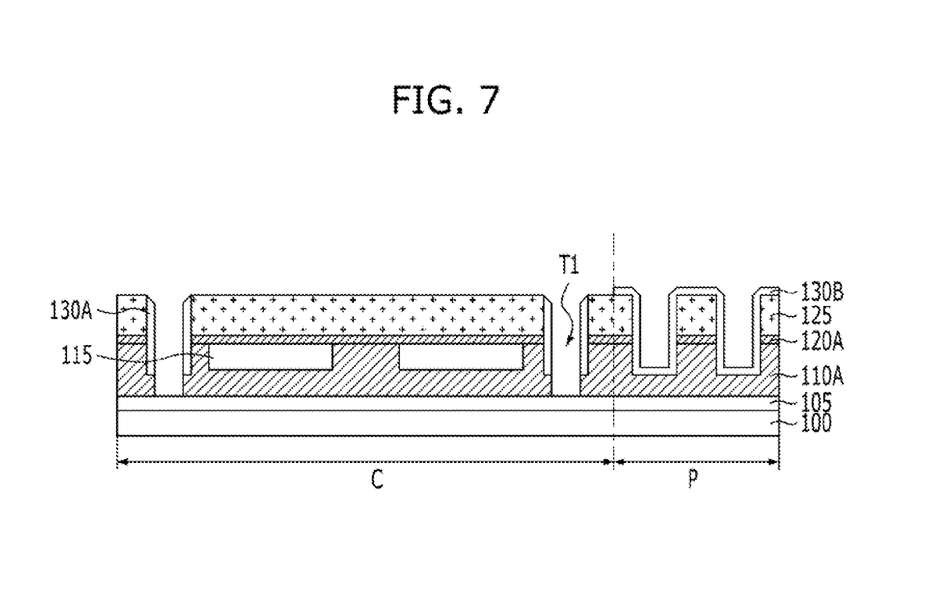

Referring to FIG. 7, a first conductive layer-primary pattern 110A for gate electrodes is formed by etching the first conductive layer 110 for gate electrodes under the trenches T1 in the cell region C. As a result of this process, a pipe connection gate electrode including the first conductive layer-primary pattern 110A and the second conductive layer pattern 120A in the cell region C is formed. The pipe connection gate electrode includes the first and the second conductive layers 110 and 120 for gate electrodes that are separated for each block and may have a form that surrounds the sacrificial layer pattern 115.

Figure 8:
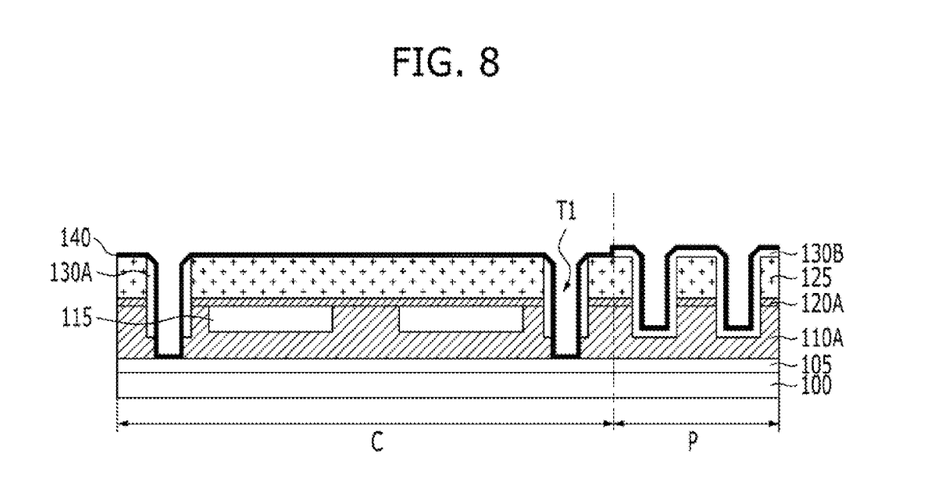

Referring to FIG. 8, a metal layer 140 is formed on the entire surface of the substrate 100 including the pipe connection gate electrode. The metal layer 140 may include one or more selected from the group that includes metals, such as cobalt (Co), nickel (Ni), titanium (Ti) platinum (Pt), and palladium (Pd) which may form a compound by a reaction with a semiconductor material, such as silicon (Si). The metal layer 140 may be formed by depositing the metals conformably using an atomic layer deposition (ALD) or chemical vapor deposition (CVD) method.

Figure 9:
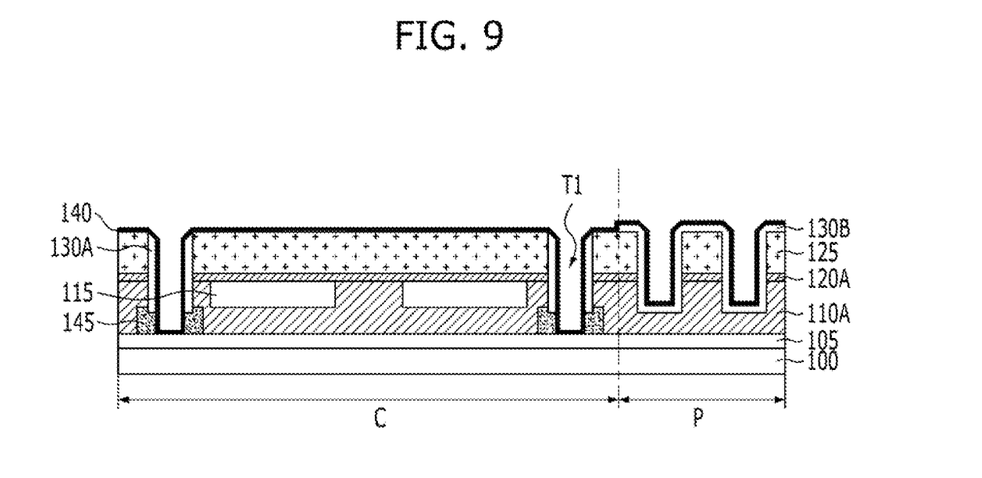

Referring to FIG. 9, the substrate 100 in which the metal layer 140 is formed is subject to an annealing process. The annealing process may be performed using a rapid thermal annealing (RTA) or furnace annealing method. The first conductive layer-primary pattern 110A that comes in contact with the metal layer 140 in the cell region C reacts with the metal layer 140 as a result of this process, thereby forming metal silicide layers 145. The metal silicide layer 145 may include metal silicides, such as cobalt silicide ($CoSi_x$), nickel silicide ($NiSi_x$), titanium silicide ($TiSi_x$), platinum silicide ($PtSi_x$), or palladium silicide ($PdSi_x$).

The metal silicide layer 145 may be formed at the lower part of the pipe connection gate electrode. The metal silicide layer 145 is not formed in the peripheral region P, because the metal layer 140 is separated from the first conductive layer-primary pattern 110A for gate electrodes and the second conductive layer pattern 120A for gate electrodes by the material layer pattern 130B. In particular, the material layer pattern 130B functions to prevent the metal silicide layer 145 from being in contact with the sacrificial layer patterns 115, because the metal silicide layers 145 is excessively formed. Accordingly, the characteristics of a memory layer to be described later may be prevented from being deteriorated.

Figure 10:
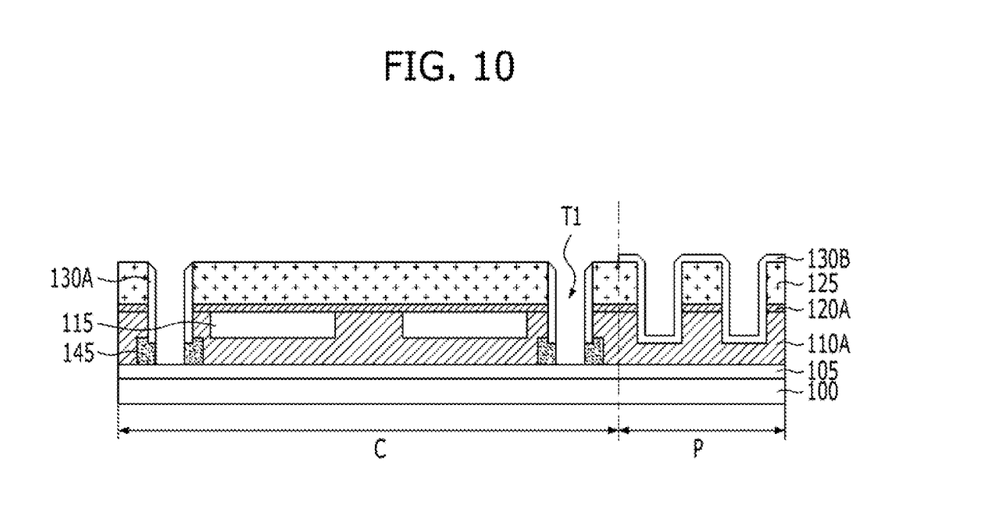

Referring to FIG. 10, a strip process of removing the metal layer 140 remaining without a reaction in the annealing process is performed. In order to remove the remaining metal layer, a mixed solution of sulfuric acid ($H_2SO_4$) and hydrogen peroxide ($H_2O_2$) that is, a sulfuric acid and hydro-peroxide mixture (SPM), may be used. After the strip process, an additional annealing process may be performed.

Figure 11:
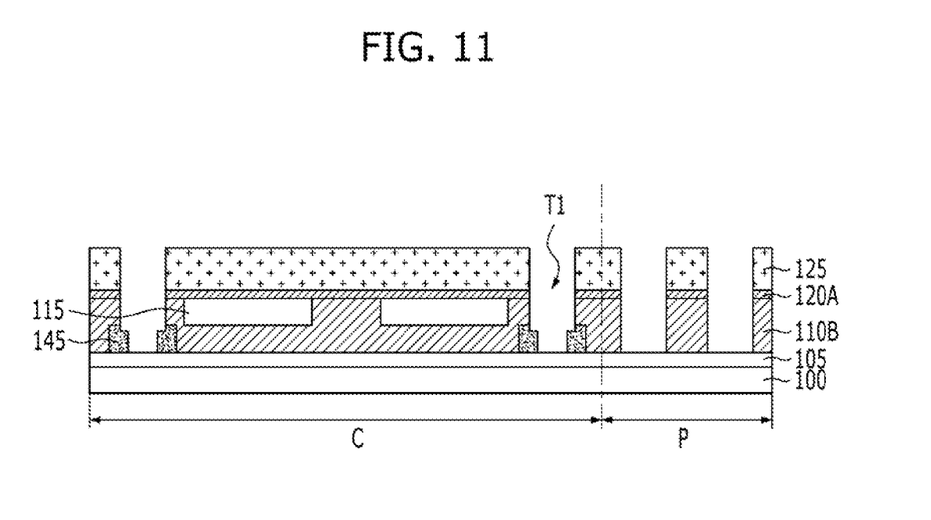

Referring to FIG. 11, after removing the spacers 130A and the material layer pattern 130B, a first conductive layer-secondary pattern 110B for gate electrodes is formed by etching the first conductive layer-primary pattern 110A for gate electrodes under the trenches T1 in the peripheral region P. In order to remove the spacers 130A and the material layer pattern 130B, a wet etch process may be performed. As a result of this process, peripheral gate electrodes, each including the first conductive layer-secondary pattern 110B for gate electrodes and the second conductive layer pattern 120A for gate electrodes are formed in the peripheral region P.

Figure 12:
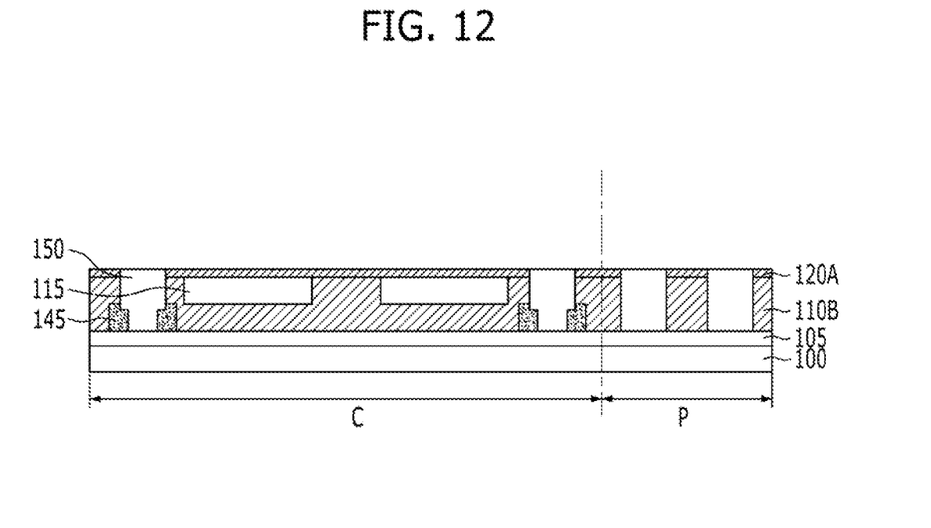

Referring to FIG. 12, after removing the hard mask patterns 125, first burial insulating layers 150 are formed within the trenches T1. The first burial insulating layers 150 may be formed by depositing an oxide-based or nitride-based material to a thickness that fills the trenches T1 and then performing a polishing process, such as chemical mechanical polishing (CMP), until a top surface of the second conductive layer patterns 120A for gate electrodes is exposed.

Figure 13:
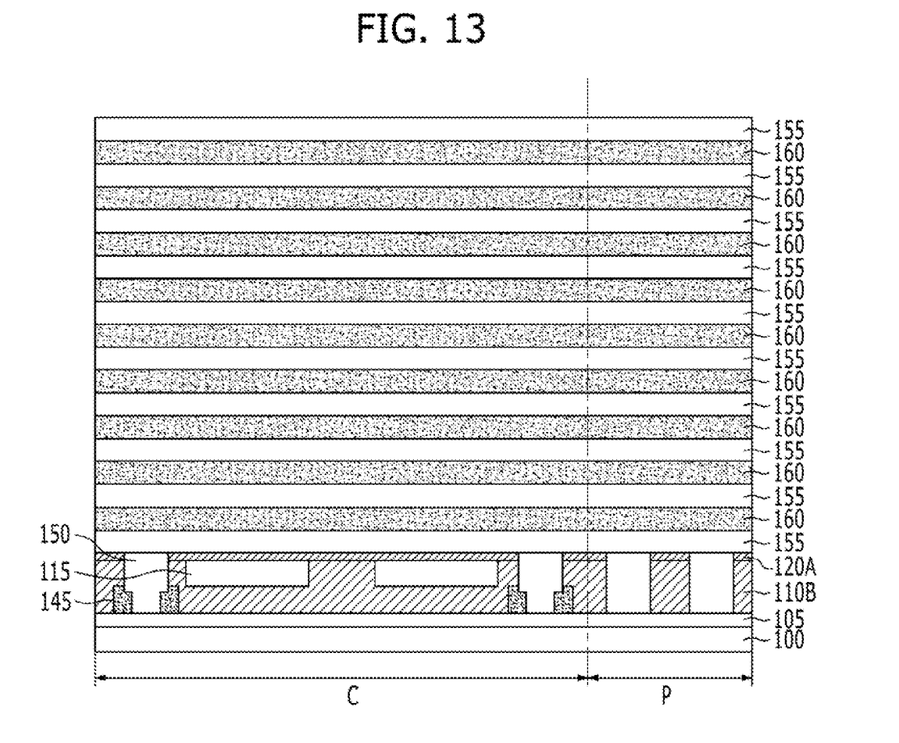

Referring to FIG. 13, a plurality of first material layers 155 and a plurality of second material layers 160 are alternately stacked over the second conductive layer patterns 120A for gate electrodes and the first burial insulating layers 150. A structure in which the plurality of first material layers 155 and the plurality of second material layers 160 are alternately stacked is hereinafter referred to as a stack structure, for convenience of description. Meanwhile, the first material layers 155 may be disposed at the top and bottom of the stack structure. This cross section illustrates that the number of second material layers 160 is 9, but this is only illustrative. The number of second material layers 160 may be less than or greater than 9.

In the present embodiment, the first material layer 155 may be an interlayer insulating layer, and the second material layer 160 may be a sacrificial layer that may be removed in a subsequent process, thus providing a space where a cell gate electrode will be formed. In this case, the first material layer 155 may include an oxide-based material, and the second material layer 160 may include a material having an etch rate different from an etch rate of the first material layer 155, for example, a nitride-based material.

However, the present invention is not limited to the above examples. In another embodiment, the first material layer 155 may be an interlayer insulating layer, and the second material layer 160 may be a conductive layer for a cell gate electrode. In this case, the first material layer 155 may include an oxide-based material, and the second material layer 160 may include a conductive material, such as polysilicon. In yet another embodiment, the first material layer 155 may be a sacrificial layer that provides a space where an interlayer insulating layer will be formed, and the second material layer 160 may be a conductive layer for a cell gate electrode. In this case, the first material layer 155 may include undoped polysilicon, and the second material layer 160 may include a conductive material, such as doped polysilicon.

Figure 14:
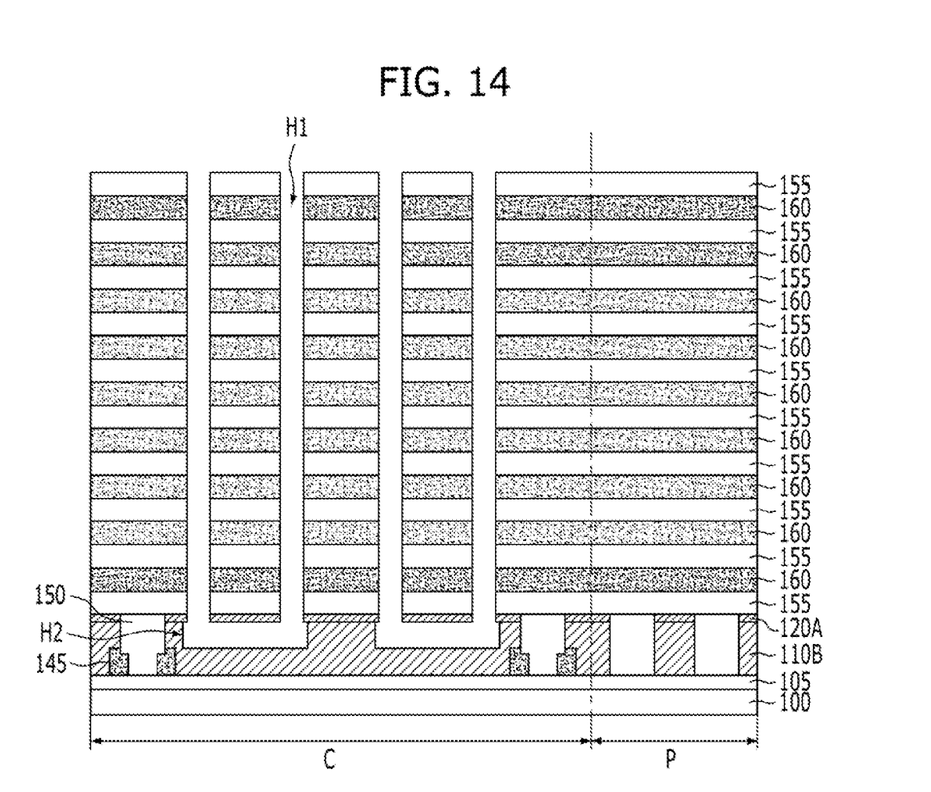

Referring to FIG. 14, pairs of main channel holes H1 through which the sacrificial layer patterns 115 are exposed are formed by selectively etching the stack structure and the second conductive layer patterns 120A for gate electrodes. Each of the main channel holes H1 may have a circular or oval shape when viewed from a plane parallel to the substrate 100, and each of the pairs of main channel holes H1 may be placed in each sacrificial layer pattern 115.

The sacrificial layer patterns 115 exposed through the pairs of main channel holes H1 are removed. In order to remove the sacrificial layer patterns 115, a wet etch process using an etch selectivity with the pipe connection gate electrode and the stack structure may be performed. As a result of this process, pipe channel holes H2 each coupling a pair of the main channel holes H1 are formed in the respective spaces from which the sacrificial layer patterns 115 are removed.

Figure 15:
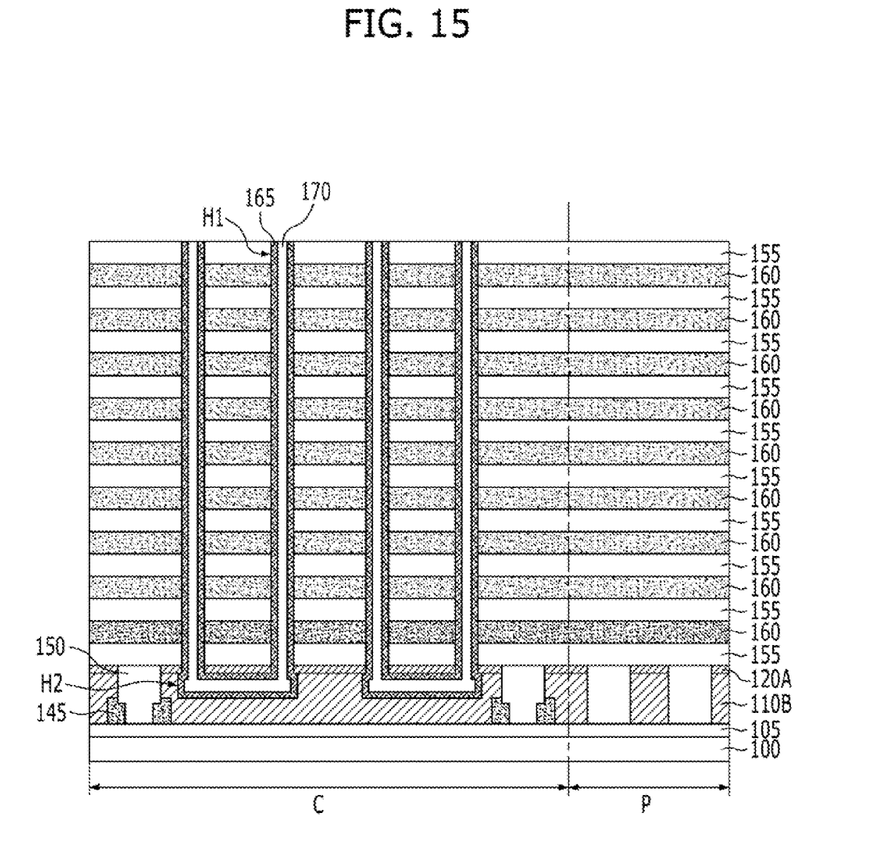

Referring to FIG. 15, a memory layer 165 and a channel layer 170 are sequentially formed on the inner walls of the pairs of main channel holes H1 and the pipe channel holes H2. The memory layer 165 may be formed by depositing a charge blocking layer, a charge trap layer, and a tunnel insulating layer sequentially.

The tunnel insulating layer is for charge tunneling and may include an oxide layer, for examples. The charge trap layer functions to store data by trapping charges, and the charge trap layer may include a nitride layer, for example. The charge blocking layer functions to preclude charges within the charge trap layer from moving externally. The charge blocking layer may include an oxide layer, for example. That is, the memory layer 165 may have a three-layer structure of Oxide-Nitride-Oxide (ONO) layers.

Furthermore, the channel layer 170 may be formed by depositing a semiconductor material, such as polysilicon, and may be divided into a main channel layer within the main channel hole H1 and a pipe channel layer within the pipe channel hole H2. In particular, the main channel layer may be used as the channel of a memory cell or a select transistor, and the pipe channel layer may be used as the channel of a pipe connection transistor. Meanwhile, in the present embodiment, the channel layer 170 is illustrated as being formed to a thickness that fully fills the main channel hole H1 and the pipe channel hole H2, but the present invention is not limited thereto. In another embodiment, the channel layer 170 may be formed to a thickness that does not fully fill the main channel hole H1 and the pipe channel hole H2.

Figure 16:
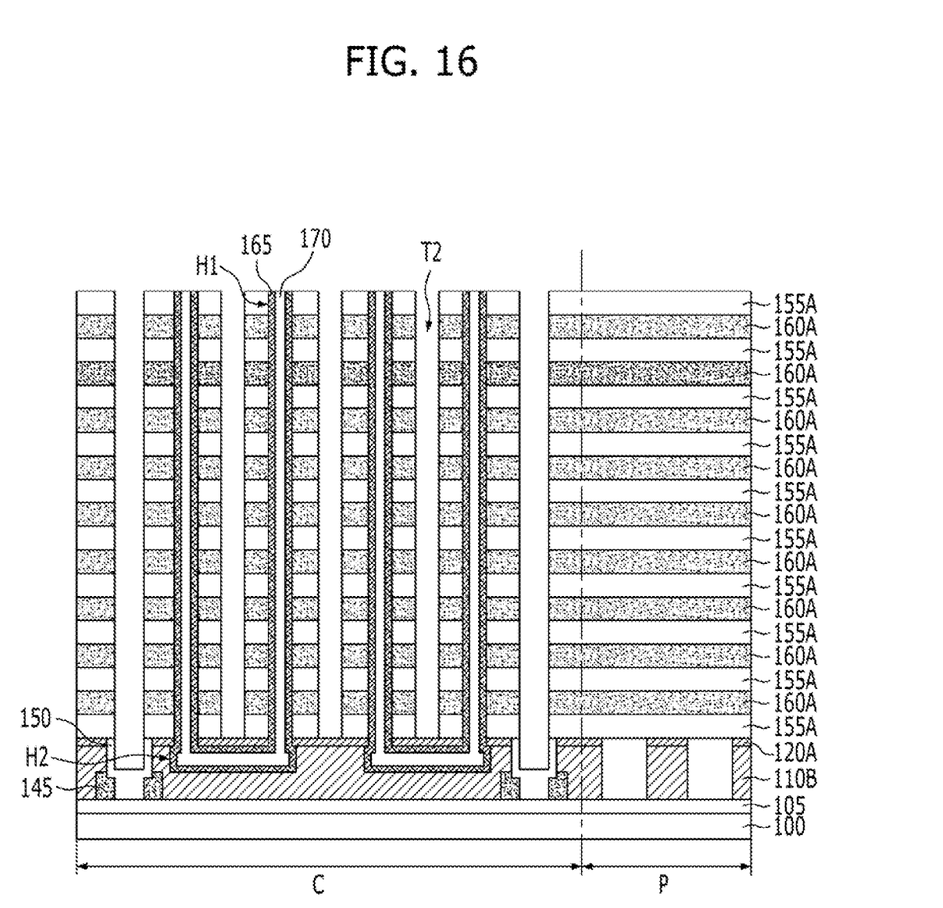

Referring to FIG. 16, slits T2 are formed by selectively etching the stack structure on both sides of each of the main channel holes H1. Each of the slits T2 separates the first material layers 155 and the second material layers 160 of the cell region C in a line form. A plurality of slits T2 may be extended in a direction crossing the cross section of FIG. 16 and may be arranged in parallel. Meanwhile, as a result of this process, part of the first burial insulating layers 150 may be etched, and the separated first material layers 155 and the separated second material layers 160 are referred to as first material layer patterns 155A and second material layer patterns 160A.

Figure 17:
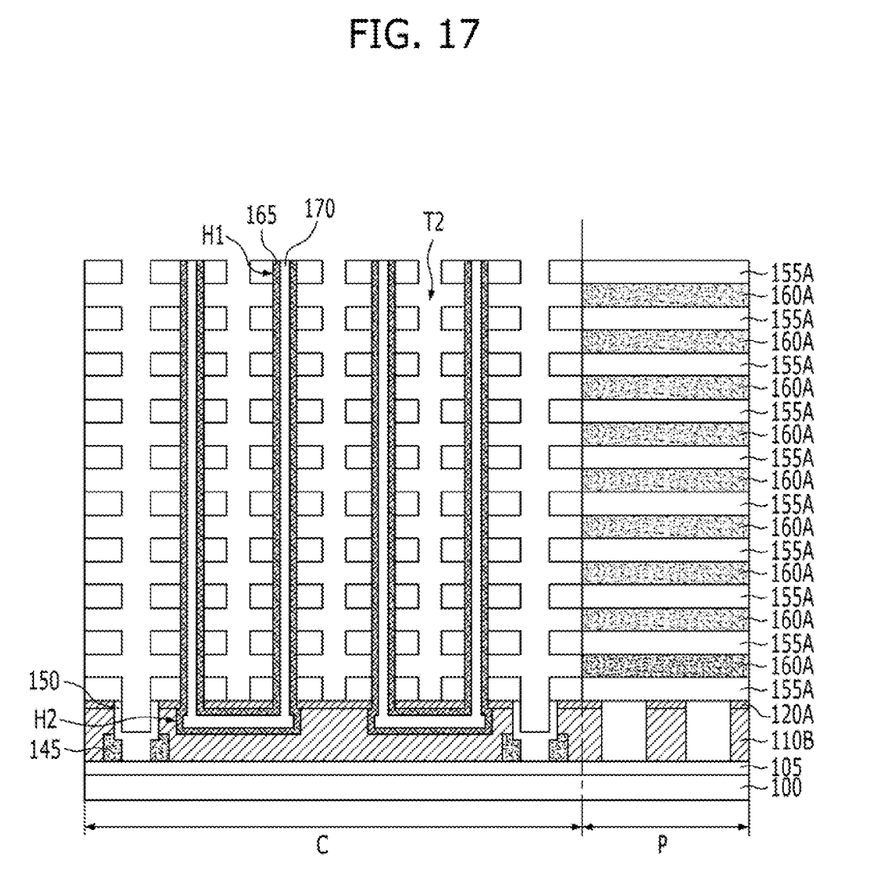

Referring to FIG. 17, the second material layer patterns 160A of the cell region C exposed by the formation of the slits T2 are removed. In order to remove the second material layer patterns 160A, a wet etch process using an etch selectivity with the first material layer patterns 155A may be performed.

Referring to FIG. 18, cell gate electrodes 175 are formed in the spaces that the second material layer patterns 160A are removed. The cell gate electrodes 175 may be formed by the following process.

First, a conductive layer (not shown) for the cell gate electrodes is formed to a thickness that fills the spaces that the second material layer patterns 160A are removed by conformally depositing a conductive material, such as metal or metal nitride, using an ALD or CVD method. Next, the conductive layer for the cell gate electrodes is etched until the sides of the first material layer patterns 155A are exposed, with the result that the conductive layer is separated for each layer and the cell gate electrode 175 is formed between the first material layer patterns 155A.

Next, second burial insulating layers 180 are formed within the slits T2. The second burial insulating layers 180 may be formed by depositing an oxide-based or nitride-based material to a thickness that fills the slits T2 and then performing a polishing process, such as CMP, until a top surface of the first material layer patterns 155A is exposed.

Referring to FIG. 19, a second interlayer insulating layer 185 is formed on the result in which the second burial insulating layers 180 is formed. The second interlayer insulating layer 185 may be formed by depositing an oxide-based or nitride-based material.

First contact plugs 190 each formed to penetrate the second interlayer insulating layer 185 of the cell region C and connected with the channel layer 170, and second contact plugs 195 each formed to penetrate the second interlayer insulating layer 185, the stack structure, the first burial insulating layer 150, and the isolation insulating layer 105 of the peripheral region P and connected with the junction (not shown) of the substrate 100 are formed. The first and the second contact plugs 190 and 195 may include a conductive material, such as doped polysilicon, metal, or metal nitride.

In accordance with the above-described fabrication method, the nonvolatile memory device in accordance with the embodiment of the present invention, such as that shown ire FIG. 19, may be fabricated.

Referring to FIG. 19, the nonvolatile memory device in accordance with the embodiment of the present invention may include the isolation insulating layers 105 over the substrate 100 including the cell region C and the peripheral region P, the pipe connection gate electrode over the isolation insulating layer 105 of the cell region C, the channel layers 170 each configured to include one or more pipe channel layers formed within the pipe connection gate electrode and a pair of the main channel layers connected with the respective pipe channel layers and extended in a direction substantially perpendicular to the substrate 100, the plurality of first material layer patterns 155A and the plurality of cell gate electrodes 175 alternately stacked along the main channel layers, the memory layer 165 interposed between the cell gate electrodes 175, the pipe connection gate electrode, and the channel layer 170, the metal silicide layers 145 configured to be in contact with the pipe connection gate electrode, the first contact plugs 190 connected with the tops of the channel layers 170, the peripheral gate electrodes over the isolation insulating layer 105 of the peripheral region P, and the second contact plugs 195 connected with the substrate 100 on both sides of the peripheral gate electrodes.

Here, the pipe connection gate electrode may include the first conductive layer-primary pattern 110A for gate electrodes and the second conductive layer patterns 120A for gate electrodes, which are separated by a block in the cell region C. The peripheral gate electrode may include the first conductive layer-secondary pattern 110B for gate electrodes and the second conductive layer pattern 120A for gate electrodes in the peripheral region P.

Meanwhile, the channel layer 170 may have a U shape, and the memory layer 165 may surround the channel layer 170. Furthermore, the cell gate electrodes 175 may surround the sides of the main channel layers and extended in a direction crossing the cross section of FIG. 19. In particular, the electric resistance of the pipe connection gate electrode is greatly reduced by the metal silicide layers 145 that are in contact with a lower part of the pipe connection gate electrode.

In accordance with the nonvolatile memory device and the method for fabricating the same in accordance with the embodiment of the present invention, the electric resistance of the pipe connection gate electrode may be greatly reduced without deteriorating the characteristics of the memory layer by forming the metal silicide layers coming in contact with the pipe connection gate electrode.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a nonvolatile memory device, comprising:
    forming a conductive layer for a gate electrode, that includes at least one or more sacrificial layer patterns, over a substrate;
    forming at least one or more trenches by etching the conductive layer to a depth that does not fully penetrate the conductive layer, wherein the trenches are formed not to overlap with the sacrificial layer patterns;
    forming spacers on sidewalls of the trenches;
    forming a pipe connection gate electrode by etching the conductive layer under the trenches; and
    forming metal silicide layers configured to be in contact with the pipe connection gate electrode.

2. The method of claim 1, wherein forming the conductive layer comprises:
    forming a first conductive layer for a gate electrode over the substrate;
    forming a plurality of grooves by selectively etching the first conductive layer for a gate electrode; and
    forming the sacrificial layer patterns within each of the grooves.

3. The method of claim 2, further comprising forming a second conductive layer for a gate electrode over the first conductive layer and the sacrificial layer patterns, after forming the sacrificial layer patterns.

4. The method of claim 1, wherein the forming of the metal silicide layers comprises:
    forming a metal layer on sides of the pipe connection gate electrode; and
    annealing the substrate in which the metal layer is formed.

5. The method of claim 4, further comprising removing the metal layer that remains without a reaction, after annealing the substrate in which the metal layer is formed.

6. The method of claim 1, wherein the sacrificial layer patterns comprise a material having an etch rate different from an etch rate of the conductive layer.

7. The method of claim 1, wherein:
    the substrate comprises a cell region and a peripheral region, and
    the method further comprises forming a plurality of peripheral gate electrodes by selectively etching the conductive layer in the peripheral region, after forming the metal silicide layers.

8. The method of claim 7, wherein the metal silicide layers are not formed on the peripheral gate electrodes.

9. The method of claim 1, further comprising:
    alternately stacking a plurality of first material layers and a plurality of second material layers over the substrate in which the pipe connection gate electrode is formed, after forming the metal silicide layers;
    forming pairs of main channel holes, each configured to have the sacrificial layer pattern exposed through each pair of main channel holes, by selectively etching the first material layers and the second material layers;
    forming a pipe channel hole connected to a pair of the main channel holes by removing the sacrificial layer patterns; and
    forming a plurality of channel layers in the pairs of main channel holes and the pipe channel holes.

10. The method of claim 9, wherein:
    the first material layers are interlayer insulating layers, and
    the second material layers are sacrificial layers.

11. The method of claim 9, further comprising forming a memory layer on inner walls of the pairs of main channel holes and the pipe channel holes, after forming the pipe channel holes.

12. The method of claim 9, wherein the second material layers comprise a material having an etch rate different from an etch rate of the first material layers.

13. The method of claim 9, further comprising:
    forming a plurality of slits to a depth that penetrates the plurality of second material layers on both sides of the main channel hole, after forming the channel layers;
    removing the second material layers exposed by the slits; and
    forming cell gate electrodes in spaces that the second material layers are removed.

* * * * *